(12) United States Patent
Yonezawa

(10) Patent No.: US 8,624,649 B2
(45) Date of Patent: Jan. 7, 2014

(54) DELAY MEASURING CIRCUIT AND DELAY MEASURING METHOD

(71) Applicant: Fujitsu Limited, Kawasaki (JP)

(72) Inventor: Takahiro Yonezawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/873,508

(22) Filed: Apr. 30, 2013

(65) Prior Publication Data

US 2013/0234770 A1 Sep. 12, 2013

Related U.S. Application Data

(63) Continuation of application No. PCT/JP2010/069530, filed on Nov. 2, 2010.

(51) Int. Cl.
*H03K 3/00* (2006.01)

(52) U.S. Cl.
USPC ............ 327/199; 327/227; 327/291; 327/365

(58) Field of Classification Search
USPC .................................. 327/199, 227, 291, 365
See application file for complete search history.

(56) References Cited

U.S. PATENT DOCUMENTS

| | | | | |
|---|---|---|---|---|
| 3,728,728 A * | 4/1973 | Vogel et al. | .................... | 342/174 |
| 4,754,330 A * | 6/1988 | Spieth | ............................ | 348/540 |
| 5,459,402 A | 10/1995 | Ueno et al. | | |
| 5,519,255 A * | 5/1996 | Burtch et al. | ................. | 307/10.2 |
| 7,418,029 B2 * | 8/2008 | Richards et al. | .............. | 375/150 |
| 7,436,876 B2 * | 10/2008 | Fisher et al. | .................... | 375/130 |
| 7,811,917 B2 * | 10/2010 | Marshall | ....................... | 438/578 |
| 8,407,025 B2 * | 3/2013 | Blaauw et al. | ................. | 702/179 |
| 2006/0263913 A1 * | 11/2006 | Marshall | .......................... | 438/14 |
| 2006/0291537 A1 * | 12/2006 | Fullerton et al. | ............... | 375/145 |
| 2008/0114568 A1 * | 5/2008 | Marshall | ........................ | 702/182 |
| 2011/0064178 A1 * | 3/2011 | Sweeney et al. | .............. | 375/371 |
| 2013/0117589 A1 * | 5/2013 | Satyamoorthy et al. | ....... | 713/320 |

FOREIGN PATENT DOCUMENTS

| | | |
|---|---|---|
| JP | 06-118122 | 4/1994 |
| JP | 06-289096 | 10/1994 |
| JP | 11-204595 | 7/1999 |
| JP | 2000-266819 | 9/2000 |
| JP | 2010-2222 | 1/2010 |
| JP | 2010-529476 | 8/2010 |
| WO | WO 2008/156289 | 12/2008 |

OTHER PUBLICATIONS

International Search Report mailed Jan. 11, 2011 in corresponding International Application No. PCT/JP2010/069530.

* cited by examiner

*Primary Examiner* — Adam Houston
(74) *Attorney, Agent, or Firm* — Staas & Halsey LLP

(57) ABSTRACT

A delay measuring circuit includes a first trigger-signal generating unit that, when a value of a signal input to a circuit under test, changes, generates a first trigger signal. The delay measuring circuit includes a second trigger-signal generating unit that, when a value of a signal output from the circuit under test changes, generates a second trigger signal. The delay measuring circuit includes a delay unit that includes a plurality of delay elements connected in series. The delay measuring circuit includes a delay information retaining unit that individually captures and retains the first trigger signal output from each of the delay elements included in the delay unit between when the first trigger signal is generated by the first trigger-signal generating unit and when the second trigger signal is generated by the second trigger-signal generating unit.

6 Claims, 9 Drawing Sheets

|  | FF1 | FF2 | FF3 | FF4 | FF5 | FF6 | FF7 |
|---|---|---|---|---|---|---|---|
| FIRST MEASUREMENT | "H" | "H" | "H" | "H" | "L" | "L" | "L" |
| SECOND MEASUREMENT | "H" | "H" | "H" | "H" | "H" | "H" | "L" |
| THIRD MEASUREMENT | "H" | "H" | "H" | "L" | "L" | "L" | "L" |

DELAY MEASURING CIRCUIT AND DELAY MEASURING METHOD

CROSS-REFERENCE TO RELATED APPLICATION

This application is a continuation of International Application No. PCT/JP2010/069530, filed on Nov. 2, 2010, the entire contents of which are incorporated herein by reference.

FIELD

The embodiments discussed herein are directed to a delay measuring circuit and a delay measuring method.

BACKGROUND

There is a known conventional technology for evaluating the delay characteristics of a circuit by measuring the length of time between when a signal is input to the circuit and when the signal is output from the circuit. An example of such technology is a technology for a delay measuring circuit that inputs a pulse signal to a circuit in which an input signal and an output signal have a one-to-one correspondence with each other and measures the delay time until the input pulse signal is output from the circuit under test.

For example, as illustrated in FIG. 12, the delay measuring circuit includes a delay circuit in which a plurality of delay elements that delay an input pulse signal and then output the input pulse signal are connected in series. Moreover, the delay measuring circuit includes a pulse generator that outputs a pulse signal with a predetermined waveform to the circuit under test and the delay circuit at the same time. Moreover, the delay measuring circuit includes a plurality of FFs (Flip-Flops) 1 to n, each of which receives a pulse signal delayed by the circuit under test and a pulse signal output from a corresponding delay element. Each of the FFs 1 to n is arranged at the subsequent stage of a corresponding delay element. FIG. 12 is a diagram for explaining the delay measuring circuit.

Each of the FFs 1 to n receives a pulse signal that has passed a different number of delay elements and therefore the timing with which the pulse signals are received from the delay elements is different. When each of the FFs 1 to n receives a pulse signal from the delay element to which it is connected before receiving a delayed pulse signal from the circuit under test, each of the FFs 1 to n captures the pulse signal received from the delay element.

In other words, each of the FFs 1 to n is classified as an FF that has captured a pulse signal and an FF that has not captured a pulse signal in accordance with the period of time for which the circuit under test delays a pulse signal. The delay measuring circuit measures the period of time for which the circuit under test delays a pulse signal by determining for each of the FFs 1 to n whether it captures a pulse signal after inputting the pulse signal to the circuit under test and the delay circuit.

Patent Document 1: Japanese Laid-open Patent Publication No. 2010-002222

However, with the technology that inputs the same pulse signal to the delay circuit and the circuit under test described above, only a pulse signal with a predetermined waveform is input to the circuit under test; therefore, there is a problem in that the worst delay, which is the maximum value of the delay time, is not appropriately measured.

For example, the circuit under test has different characteristics in some cases between the case where a signal is input whose logical value changes from a low level to a low level via a high level and the case where a signal is input whose logical value changes from a high level to a high level via a low level. In other words, the circuit under test outputs a signal with a different delay time in some cases depending on the direction in which the input signal changes, i.e., for each of the direction of change from a low level to a high level and the direction of change from a high level to a low level. Therefore, when the delay measuring circuit measures the delay of the input signal in a case where the signal input to the circuit under test changes in one direction, for example, from a low level to a high level, the worst delay is not appropriately measured in some cases.

SUMMARY

According to an aspect of an embodiment, a delay measuring circuit includes a first trigger-signal generating unit that, when a value of a signal input to a circuit under test, in which an input signal and an output signal have a one-to-one correspondence with each other, changes, generates a first trigger signal. The delay measuring circuit includes a second trigger-signal generating unit that, when a value of a signal output from the circuit under test changes, generates a second trigger signal. The delay measuring circuit includes a delay unit that includes a plurality of delay elements, which delay the first trigger signal generated by the first trigger-signal generating unit, connected in series. The delay measuring circuit includes a delay information retaining unit that individually captures and retains the first trigger signal output from each of the delay elements included in the delay unit between when the first trigger signal is generated by the first trigger-signal generating unit and when the second trigger signal is generated by the second trigger-signal generating unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings.

[a] First Embodiment

Figure 1:
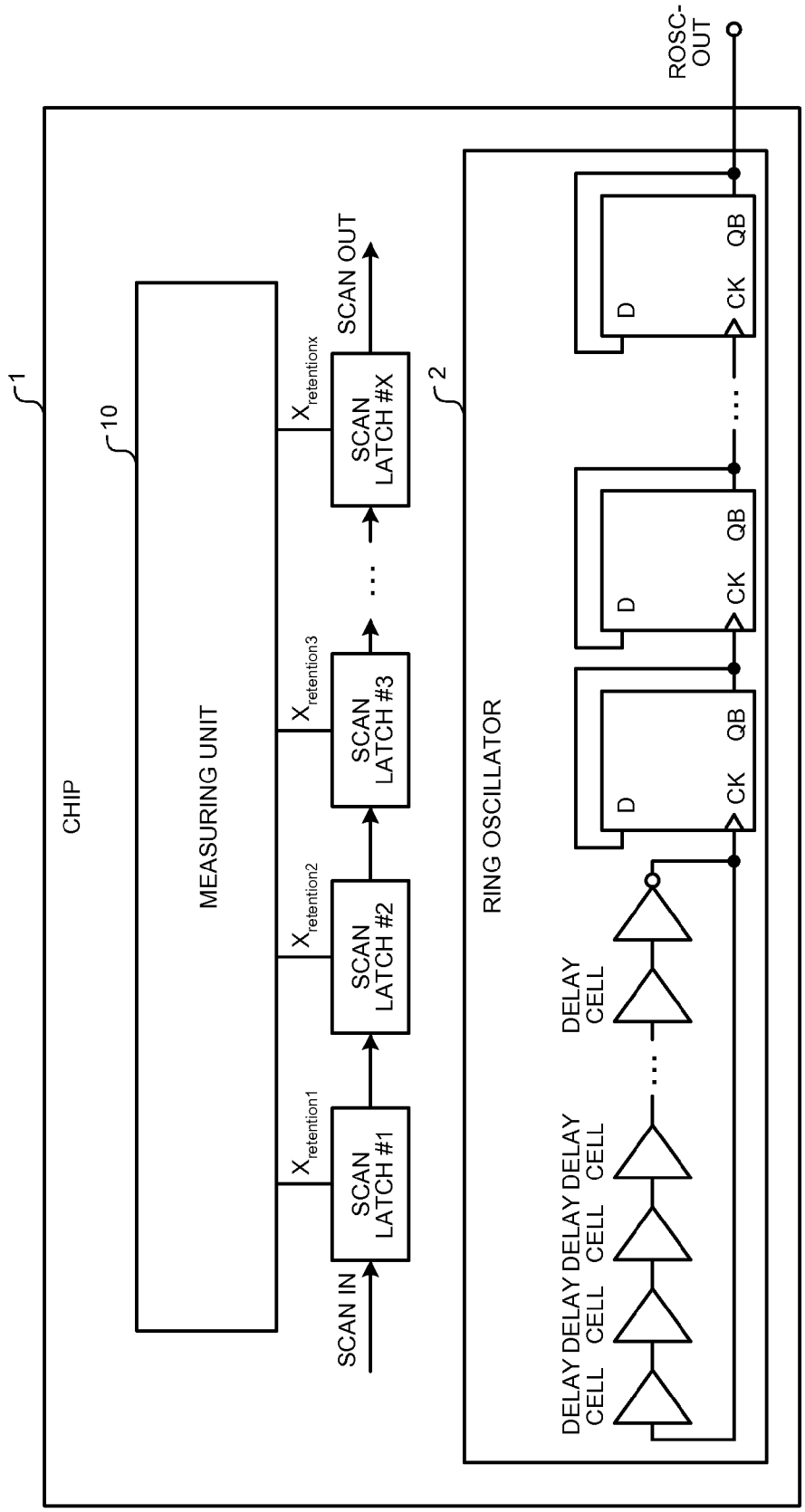
FIG. 1 is a diagram for explaining a chip that includes a measuring unit according to a first embodiment.

In the first embodiment below, an example of a chip that includes a delay measuring circuit will be described with reference to FIG. 1. FIG. 1 is a diagram for explaining the chip that includes the measuring unit according to the first embodiment.

As illustrated in FIG. 1, a chip 1 includes a ring oscillator 2 and a measuring unit 10. Moreover, the chip 1 includes scan latches #1 to #X.

The scan latches #1 to #X are latches that receive from the measuring unit 10, which will be described later, $X_{retention1}$ to $X_{retentionx}$ which are signals indicating delay information on the circuit under test and retain the received signals. Therefore, the chip 1 can obtain the delay characteristics of the circuit under test by obtaining the $X_{retention1}$ to $X_{retentionx}$ retained in the scan latches #1 to #X.

The ring oscillator 2 includes an oscillation circuit in which a plurality of delay cells and one inverter are connected. The delay cells are delay elements of the same type as delay cells included in the measuring unit 10, which will be described later. Moreover, the ring oscillator 2 includes a divider that includes a plurality of D flip-flops at the subsequent stage of the oscillation circuit.

The ring oscillator 2 having such a configuration generates a high frequency signal corresponding to the delay characteristics of the delay cells by using the oscillation circuit. Moreover, the ring oscillator 2 lowers the frequency of the generated signal by using the divider and then outputs the signal from the chip 1. A user measures the frequency of the signal output from the ring oscillator 2 and calculates in advance the delay time per delay cell on the basis of the value of the measured frequency.

Specifically, the measuring unit 10, which will be described later, measures the delay characteristics of the circuit under test by using the delay cells. However, the delay value of each delay cell differs due to process variations in the manufacturing process of the chip 1.

Therefore, in the first embodiment, the measuring unit 10 and the ring oscillator 2 are mounted on the same chip 1. Before performing a process of measuring the delay characteristics of the circuit under test, the delay time per delay cell included in the ring oscillator 2 is calculated in advance. As a result, the delay time of the circuit under test can be calculated by using the delay time of the delay cells in which the process variations are taken into consideration; therefore, the delay time of the circuit under test can be accurately calculated.

Figure 2:
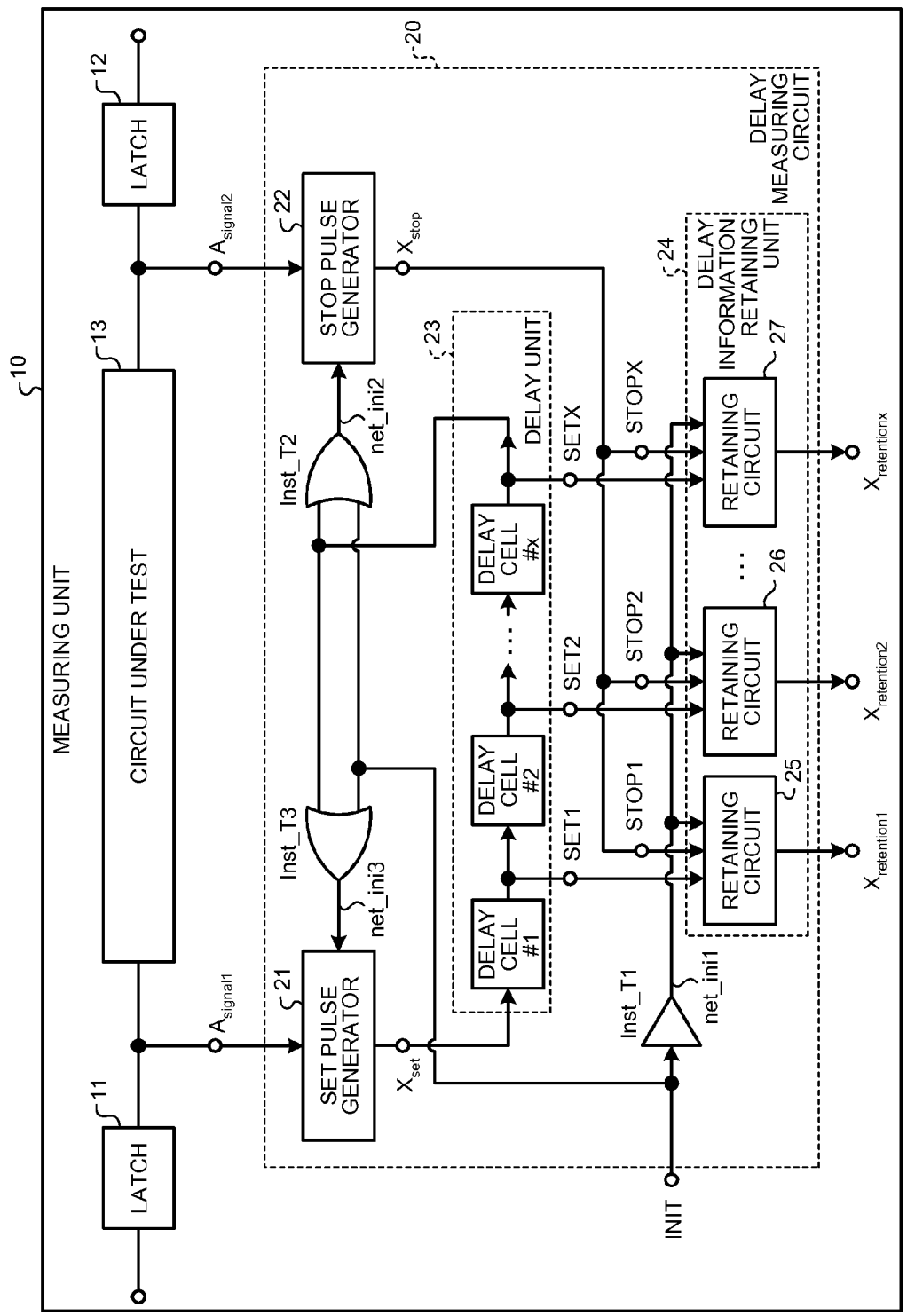
FIG. 2 is a diagram for explaining the measuring unit according to the first embodiment.

Next, each component included in the measuring unit 10 will be described with reference to FIG. 2. FIG. 2 is a diagram for explaining the measuring unit according to the first embodiment. As illustrated in FIG. 2, the measuring unit 10 includes a latch 11, a latch 12, a circuit under test 13, and a delay measuring circuit 20. The delay measuring circuit 20 includes a set pulse generator 21, a stop pulse generator 22, a delay unit 23, and a delay information retaining unit 24. The delay unit 23 includes delay cells #1 to #x. The delay information retaining unit 24 includes retaining circuits 25 to 27.

The delay measuring circuit 20 includes an Inst_T1, which is a delay element, and Inst_T2 and T3, which are OR gates. Moreover, the delay measuring circuit 20 includes a wire net_ini1, which connects the Inst_T1 and each of the retaining circuits 25 to 27, and a wire net_ini2, which connects the Inst_T2 and the stop pulse generator 22. Moreover, the delay measuring circuit 20 includes a wire net_ini3, which connects the Inst_T3 and the set pulse generator 21.

In the following description, the delay measuring circuit 20 includes retaining circuits the number of which is the same as that of the delay cells #1 to #x; however, retaining circuits other than the retaining circuits 25, 26, and 27 are omitted in FIG. 2. Moreover, in the following description, each of the retaining circuits 26 to 27 is a retaining circuit that has a circuit configuration similar to the retaining circuit 25 and performs an operation similar to the retaining circuit 25; therefore, descriptions of the retaining circuits 26 to 27 are omitted. Moreover, in the following description, each of the delay cells #2 to #x is the same as the delay cell #1; therefore, descriptions thereof are omitted.

The latch 11 is a circuit that transmits an $A_{signal1}$ signal to the circuit under test 13 and the set pulse generator 21. The latch 12 is a circuit that receives an $A_{signal2}$ signal output from the circuit under test 13. The circuit under test 13 is not a circuit that receives an input from other paths but is a circuit in which an input signal and an output signal have a one-to-one correspondence with each other. Specifically, the circuit under test 13 is a circuit that, when the $A_{signal1}$ signal is received from the latch 11, delays the received $A_{signal1}$ signal and then outputs it as the $A_{signal2}$ signal. The $A_{signal2}$ signal may be a signal that is a logical inversion of the $A_{signal1}$ signal. The circuit under test 13 is a circuit that includes, for example, only a buffer and an inverter and is a circuit without combinational logic.

Figure 3:
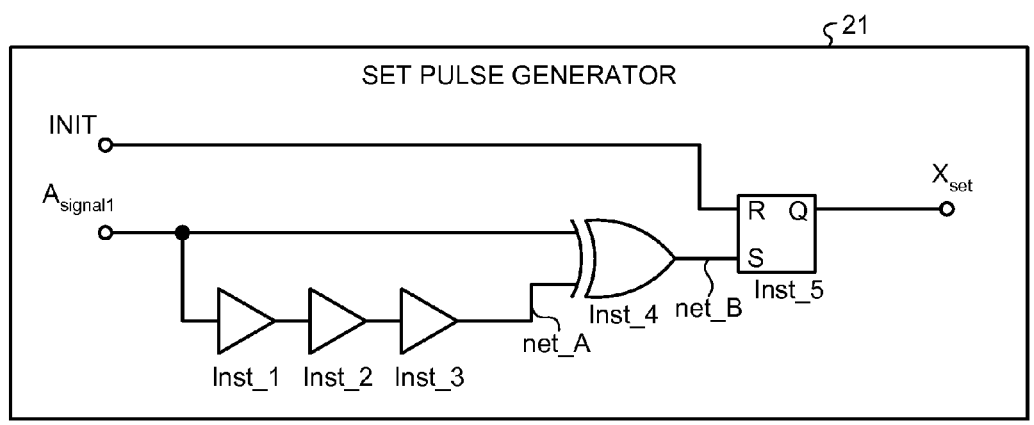
FIG. 3 is a diagram for explaining a set pulse generator according to the first embodiment.

FIG. 3 is a diagram for explaining the set pulse generator according to the first embodiment. When the logical value of a signal input to the circuit under test 13 changes from a low level to a high level or from a high level to a low level, the set pulse generator 21 sets an output signal $X_{set}$ to a predetermined value. Specifically, as illustrated in FIG. 3, the set pulse generator 21 includes Inst_1 to 3, which are delay elements, an Inst_4, which is an XOR (Exclusive-OR) gate, and an Inst_5, which is an RS flip-flop.

For example, in the set pulse generator 21, when the $A_{signal1}$ signal is received from the latch 11, the $A_{signal1}$ signal is directly input to one input terminal of the XOR gate Inst_4. Then, the $A_{signal1}$ signal delayed by the delay elements Inst_1, Inst_2, and Inst_3 is input to the other input terminal of the XOR gate Inst_4. Then, the XOR gate Inst_4 performs an exclusive OR operation on the two input signals; therefore, the set pulse generator 21 outputs a high pulse signal to a net_B for the period of the delay time due to the delay elements Inst_1, Inst_2, and Inst_3 after the value of the $A_{signal1}$ signal changes. When a pulse generated in the Inst_4 is input to the terminal S of the RS flip-flop Inst_5 via the net_B, the RS flip-flop Inst_5 sets the output terminal Q to high and outputs high as the $X_{set}$ signal.

Figure 4:
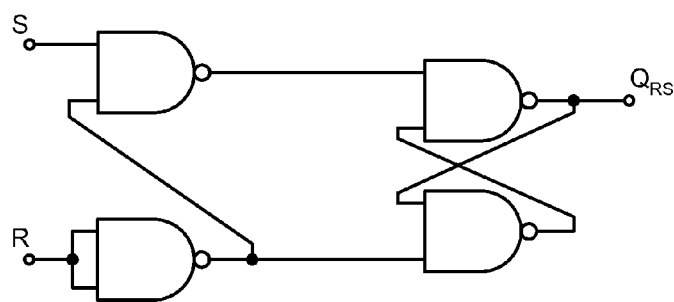
FIG. 4 is a diagram for explaining a circuit example of an RS flip-flop.

FIG. 4 is a diagram for explaining a circuit example of the RS flip-flop. As illustrated in FIG. 4, the Inst_5 in FIG. 3 is an RS flip-flop that includes NAND gates. Therefore, the Inst_5 outputs a high-level signal as the $X_{set}$ signal between when the set pulse generator 21 receives the $A_{signal1}$ signal and when the set pulse generator 21 is reset by application of an INIT signal. In the example in FIG. 3, when a high-level signal is applied to the INIT signal, the RS flip-flop Inst_5 is reset.

Moreover, when a signal delayed by the delay cell #x, which will be described later, is output, the set pulse generator 21 receives the signal output from the delay cell #x from the INIT terminal illustrated in FIG. 3 via the Inst_T3 and the net_ini3. In other words, the set pulse generator 21 receives a signal output from the delay cell #x as the INIT signal. Then, the set pulse generator 21 resets the state of the Inst_R5 by inputting the received INIT signal to the terminal R (Reset terminal) of the Inst_R5.

When the measuring unit 10 receives the INIT signal, the set pulse generator 21 receives the INIT signal via the Inst_T3 and the net_ini3. Then, the set pulse generator 21 resets the state of the Inst_R5 by inputting the received INIT signal to the terminal R of the Inst_R5.

In this manner, the set pulse generator 21 generates a predetermined pulse signal in response to a change in the $A_{signal1}$ signal. Therefore, the set pulse generator 21 generates a predetermined pulse signal not only when a signal whose logical value transitions from a low level to a high level is received as the $A_{signal1}$ signal but also when a signal whose logical value transitions from a high level to a low level is received as the $A_{signal1}$ signal.

In other words, whatever the waveform of a signal that is input to the circuit under test 13, the set pulse generator 21 can generate the $X_{set}$ signal that is a predetermined pulse signal for each of the delay cells #1 to #x. As a result, the delay measuring circuit 20 can appropriately measure the delay characteristics of the circuit under test 13 regardless of the waveform of the signal input to the circuit under test 13.

Figure 5:
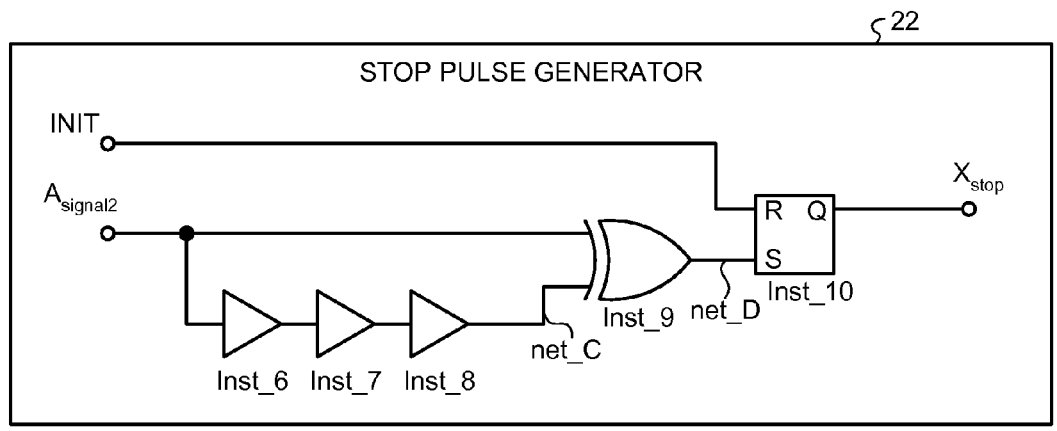
FIG. 5 is a diagram for explaining a stop pulse generator according to the first embodiment.

Here the description returns to FIG. 2. When the value of the $A_{signal2}$ signal output from the circuit under test 13 changes, the stop pulse generator 22 generates $X_{stop}$ with a predetermined waveform regardless of whether the change is positive or negative. Specifically, as illustrated in FIG. 5, the stop pulse generator 22 includes Inst_6 to 8, which are delay elements, an Inst_9, which is an XOR gate, and an Inst_10, which is an RS flip-flop. FIG. 5 is a diagram for explaining the stop pulse generator 22 according to the first embodiment.

As illustrated in FIG. 5, the stop pulse generator 22 has a circuit configuration similar to the set pulse generator 21. When the logical value of the $A_{signal2}$ signal output from the circuit under test 13 changes, the stop pulse generator 22 generates the $X_{stop}$ with a predetermined waveform regardless of whether the change is positive or negative. For example, when the value of the $A_{signal2}$ signal transitions from a high level to a low level or when the value of the $A_{signal2}$ signal transitions from a low level to a high level, the stop pulse generator 22 generates the $X_{stop}$ that is a pulse signal with a predetermined waveform.

Moreover, when the delay cell #x, which will be described later, outputs a signal, the stop pulse generator 22 receives the signal output from the delay cell #x as the INIT signal via the Inst_T2 and the net_ini2. Then, the stop pulse generator 22 resets the state of the Inst_10, which is an RS flip-flop. Moreover, when the measuring unit 10 receives the INIT signal, the stop pulse generator 22 receives the INIT signal via the Inst_T2 and the net_ini2 and resets the state of the Inst_10.

In this manner, the stop pulse generator 22 can generate the $X_{stop}$ signal that is a pulse signal with a predetermined waveform at a timing at which the circuit under test 13 outputs an input signal regardless of the waveform of the $A_{signal2}$ signal. As a result, the delay measuring circuit 20 can measure the delay characteristics of the circuit under test 13 by using a signal having any waveform.

In the following description, with regard to the $X_{stop}$ signal generated by the stop pulse generator 22, a signal transmitted to the retaining circuit 25 is referred to as a STOP1 signal, a signal transmitted to the retaining circuit 26 is referred to as a STOP2 signal, and a signal transmitted to the retaining circuit 27 is referred to as a STOPX.

Here the description returns to FIG. 2. When the delay cell #1 receives the $X_{set}$ signal from the set pulse generator 21, the delay cell #1 delays the received $X_{set}$ signal and transmits the delayed $X_{set}$ signal to the delay cell #2 and the retaining circuit 25.

Moreover, when the delay cell #2 receives the $X_{set}$ signal, the delay cell #2 delays the received $X_{set}$ signal and transmits the delayed $X_{set}$ signal to the delay cell #3 and the retaining circuit 26. Moreover, the delay cell #x transmits the delayed $X_{set}$ signal to the retaining circuit 27 and the Inst_T2 and T3.

In other words, the delay cells #1 to #x are delay elements that, when the $X_{set}$ signal is received, transmit the delayed $X_{set}$ signal to the retaining circuits 25 to 27 in stages. In the following description, the $X_{set}$ signal transmitted to the retaining circuit 25 from the delay cell #1 is referred to as a SET1 signal and the $X_{set}$ signal transmitted to the retaining circuit 26 from the delay cell #2 is referred to as a SET2 signal. Moreover, in the following description, the $X_{set}$ signal transmitted to the retaining circuit 27 from the delay cell #x is referred to as a SETX signal.

The delay information retaining unit 24 individually captures and retains the SET1 to SETX signals output from the delay cells #1 to #x, respectively, between when the $X_{set}$ signal is generated and when the $X_{stop}$ signal is generated. Specifically, the delay information retaining unit 24 includes the retaining circuits 25 to 27. Moreover, the delay information retaining unit 24 transmits the SET1 signal transmitted from the delay cell #1 and the STOP1 signal generated by the stop pulse generator 22 to the retaining circuit 25.

Moreover, the delay information retaining unit 24 transmits the SET2 signal transmitted from the delay cell #2 and the STOP2 signal generated by the stop pulse generator 22 to the retaining circuit 26. Moreover, the delay information retaining unit 24 transmits the SETX signal transmitted from the delay cell #x and the STOPX signal generated by the stop pulse generator 22 to the retaining circuit 27.

In other words, the delay information retaining unit 24 transmits the SET1 to SETX signals output from the delay cells #1 to #x to the different retaining circuits 25 to 27, respectively. Moreover, the delay information retaining unit 24 transmits the $X_{stop}$ signal generated by the stop pulse generator 22 to each of the retaining circuits 25 to 27.

As will be described later, the retaining circuits 25 to 27 retain the SET1 to SETX signals, respectively, when triggered by the $X_{stop}$ signal. Therefore, the delay information retaining unit 24 can individually capture and retain the SET1 to SETX signals output from the delay cells #1 to #x, respectively, between when the $X_{set}$ signal is generated and when the $X_{stop}$ signal is generated.

The circuit configuration that each of the retaining circuits 25 to 27 included in the delay information retaining unit 24 has and the process performed by each of the retaining circuits 25 to 27 will be described below. The retaining circuit 25 is connected to the delay cell #1 and the stop pulse generator 22. When the retaining circuit 25 receives the SET1 signal transmitted from the delay cell #1 before the STOP1 signal generated by the stop pulse generator 22, the retaining circuit 25 captures and retains the received SET1 signal.

The retaining circuit 25 includes a D flip-flop that captures and retains the SET1 signal. When the D flip-flop retains the SET1 signal, the retaining circuit 25 terminates the connection between the D flip-flop and the stop pulse generator 22. Moreover, when the D flip-flop retains the SET1 signal, the retaining circuit 25 fixes the circuit portion that inputs the STOP1 signal to the D flip-flop at a low level. Moreover, when the retaining circuit 25 receives the INIT signal via the Inst_T1 and the net_ini1, the retaining circuit 25 resets the state of the D flip-flop.

Figure 6:
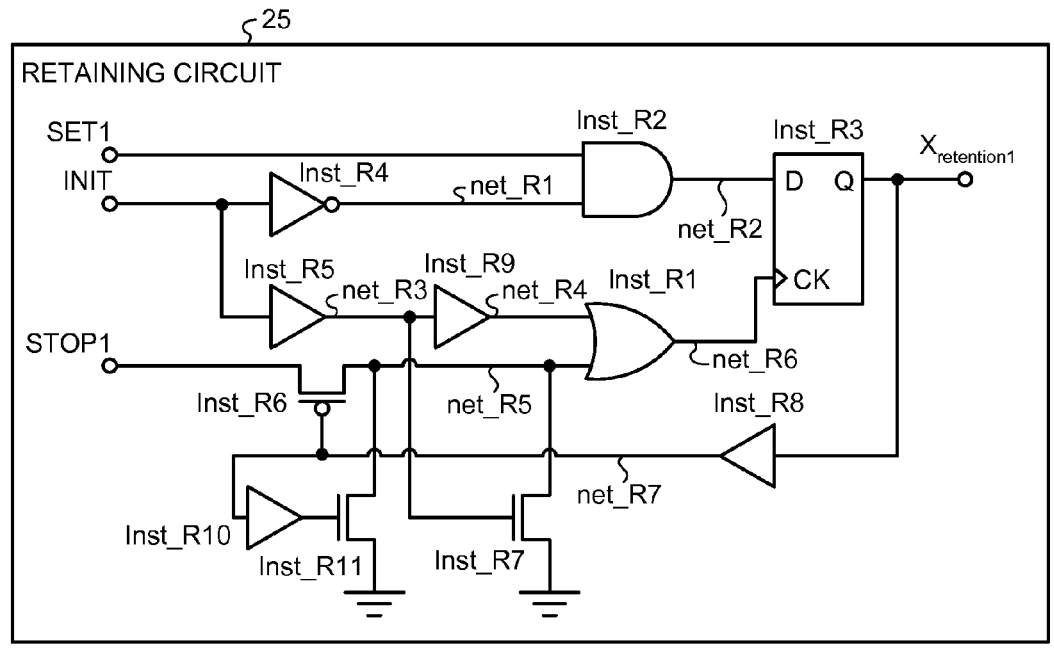
FIG. 6 is a diagram for explaining a retaining circuit according to the first embodiment.

FIG. 6 is a diagram for explaining the retaining circuit 25 according to the first embodiment. As illustrated in FIG. 6, the retaining circuit 25 includes an Inst_R1, which is an OR gate, an Inst_R2, which is an AND gate, an Inst_R3, which is a D flip-flop, and an Inst_R4, which is a NOT gate. Moreover, the retaining circuit 25 includes an Inst_R5, an Inst_R8, and an Inst_R10, which are delay elements.

Figures 7, 8:
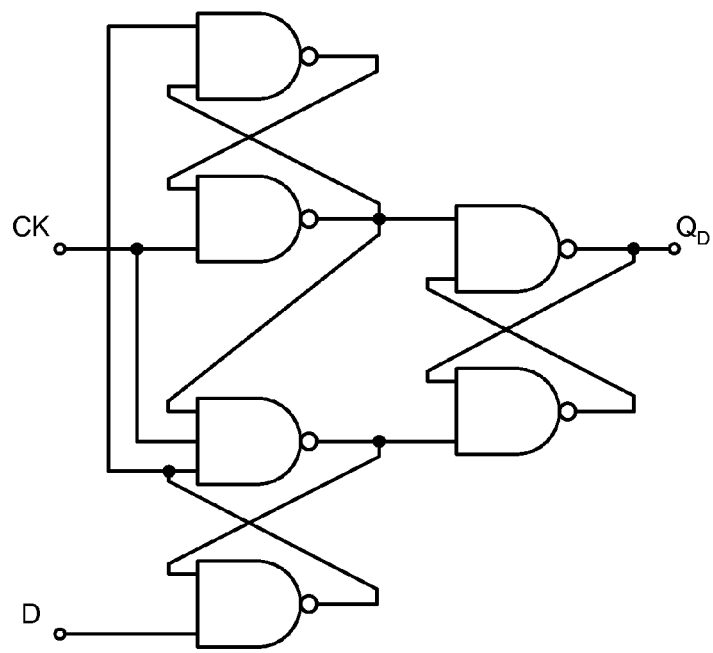
FIG. 7 is a diagram for explaining a circuit example of a D flip-flop.
FIG. 8 is a diagram for explaining a change in delay characteristics of a circuit under test.

Moreover, the retaining circuit 25 includes an Inst_R6, which is a P-type MOSFET (Metal Oxide Semiconductor Field Effect Transistor), and Inst_R7 and R11, which are N-type MOSFETs. As illustrated in FIG. 7, the Inst_R3 is a D flip-flop composed of NAND gates. FIG. 7 is a diagram for explaining a circuit example of the D flip-flop.

The operation performed by the retaining circuit 25 will be described below with a specific example. For example, the retaining circuit 25 receives the SET1 signal from the delay cell #1. The SET1 signal is a signal whose logical value transitions from a low level to a low level via a high level. Moreover, a low-level signal is input to the INIT signal and the output value of the D flip-flop Inst_R3 is reset to a low level.

When a low-level signal is input to the INIT signal, a high-level signal is input to one input terminal of the Inst_R2 via the Inst_R4, which is a NOT gate. Therefore, when the INIT signal is a low level and the retaining circuit 25 receives a high-level signal as the SET1 signal, the Inst_R2 inputs a high-level signal to the terminal D of the Inst_R3, which is a D flip-flop, via the net_R2.

When the output value of the D flip-flop Inst_R3 is low, the P-type transistor Inst_R6 is in a conductive state. Therefore, the STOP1 signal from the stop pulse generator 22 is transmitted to one input terminal of the OR gate Inst_R1 via the net_R5. Because a low-level signal is input to the other input terminal of the OR gate Inst_R1 as the INIT signal, the STOP1 signal is transmitted to the net_R6 via the Inst_R6 and the Inst_R1.

Therefore, when the INIT signal input to the retaining circuit is at a low level and the STOP1 signal changes from a low level to a high level, a signal input to the terminal CK (CLOCK) of the Inst_R3 from the Inst_R1 via the net_R6 is changed from a low level to a high level. As a result, the Inst_R3 captures a high-level signal input to the terminal D and sets the output terminal Q to a high level. The high-level signal output from the terminal Q of the D flip-flop Inst_R3 is transmitted to the scan latch #1 as the $X_{retention1}$ signal.

In other words, the Inst_R3 is a D flip-flop that retains a signal input to the terminal D when triggered by the application of a high-level voltage to the terminal CK and outputs the retained signal to the scan latch #1 as the $X_{retention1}$ signal.

Moreover, the Inst_R3 outputs the $X_{retention1}$ signal to the Inst_R6 via the Inst_R8 and the net_R7. Therefore, when the output of the terminal Q of the Inst_R3, which is a D flip-flop, is set high, the net_R7 becomes a high level and thus the Inst_R6, which is a P-type MOSFET, becomes non-conductive.

In other words, when the output of the terminal Q of the Inst_R3 is fixed at a low level, the Inst_R6 enters a conductive state and transmits the STOP1 signal to the net_R5 and the Inst_R1, which is an OR gate. Moreover, when the SET1 signal becomes a high level, the Inst_R3 sets the signal of the output of the terminal Q to a high level; therefore, the net_R7 becomes a high level.

As a result, the Inst_R6, which is a P-type MOSFET, becomes non-conductive so that the STOP1 signal is not input to the Inst_R1 via the net_R5. Therefore, in the Inst_R3, a high-level voltage is not applied to the terminal CK and thus the $X_{retention1}$ signal whose logical value is at a high level is retained.

Moreover, the Inst_R3 transmits the $X_{retention1}$ signal to the Inst_R11 via the Inst_R8, the net_R7, and the Inst_R10. Then, the Inst_R11, which is an N-type MOSFET, connects the net_R5 to the ground and fixes the potential of the net_R5 at 0 V. As a result, the output of the Inst_R1 is fixed at a low level; therefore, the Inst_R3 continues to retain the $X_{retention1}$ signal at a high level.

In this manner, when the D flip-flop of each of the retaining circuits 25 to 27 retains a corresponding one of the SET1 to SETX signals, the delay information retaining unit 24 terminates the connection between the D flip-flop and the stop pulse generator 22 and fixes the circuit portion that inputs the $X_{stop}$ signal to the D flip-flop at a low level. Therefore, each of the retaining circuits 25 to 27 can prevent the circuit portion that inputs the $X_{stop}$ signal to the D flip-flop from generating a high-level voltage due to the effect of noise. As a result, the delay measuring circuit 20 can appropriately continue to retain information on the delay retained in the D flip-flops.

Moreover, when a high-level signal is input to the retaining circuit 25 as the INIT signal, a low-level signal is input to one input terminal of the Inst_R2 via the Inst_R4, which is a NOT gate. As a result, the output of the AND gate Inst_R2 becomes low and thus a low-level signal is input to the terminal D of the D flip-flop Inst_R3. On the other hand, when a high-level signal is input as the INIT signal, the received INIT signal is input to one input terminal of the Inst_R1 via the Inst_R5 and the Inst_R9.

The INIT signal at a high level is input to the gate of the N-type transistor Inst_R7 via the net_R3 and the N-type transistor Inst_R7 becomes conductive. As a result, the net_R5 and the ground are connected and the other terminal of the OR gate Inst_R1 is fixed at a low level. As described above, when a high-level signal is input as the INIT signal, a low-level signal is input to the terminal D of the Inst_R3. At the same time, a high-level signal is input to the terminal CK of the Inst_R3 via the Inst_R5, the Inst_R9, and the Inst_R1. The terminal CK of the Inst_R3 can be changed to a high level after the terminal D of the Inst_R3 becomes low by delaying transmission of the signal to the terminal CK of the Inst_R3 by the buffers Inst_R5 and Inst_R9.

Therefore, when a high-level signal is input to the INIT signal, the retaining circuit 25 causes a voltage value that is to be applied to the terminal D of the Inst_R3 to transition to a voltage whose logical value becomes a low level and causes a voltage that is to be applied to the terminal CK to transition to a voltage whose logical value becomes a high level regardless of the value of the SET1 signal. Then, the Inst_R3 captures the low-level value input to the terminal D. In other words, when the retaining circuit 25 receives the INIT signal, the retaining circuit 25 resets the state of the Inst_R3 regardless of the values of the SET1 signal and the STOP1 signal.

As described above, the delay measuring circuit 20 includes the retaining circuits 25 to 27. When the retaining circuit 25 receives the STOP1 signal after receiving the SET1 signal, the retaining circuit 25 retains the SET1 signal and outputs the retained SET1 signal to the scan latch #1 as the $X_{rentention1}$ signal. Therefore, the chip 1 can determine whether the $X_{set}$ signal has passed the delay cell #1 between when the $X_{set}$ signal is generated and when the $X_{stop}$ signal is generated on the basis of the $X_{rentention1}$ signal retained in the scan latch #1.

The retaining circuits 26 to 27 also perform a process in a similar manner to the retaining circuit 25. Then, the retaining circuits 26 to 27 output the $X_{retention2}$ to $X_{retentionx}$ signals to the scan latches #2 to #X, respectively. In other words, the delay measuring circuit 20 outputs the $X_{retention1}$ to $X_{retentionx}$ signals, which indicate the number of delay cells that the $X_{set}$ signal has passed between when the $X_{set}$ signal is output and when the $X_{stop}$ signal is output, to the scan latches #1 to #X, respectively.

The period of time for which the $X_{set}$ signal is delayed by one delay cell can be obtained from ROSC-OUT of the ring oscillator 2. As a result, the period of time during which a signal propagates through the circuit under test 13 can be accurately measured on the basis of whether the logical values of the $X_{rentention1}$ to $X_{retentionx}$ signals retained in the scan latches #1 to #X are at a high level or a low level.

The delay characteristics of the circuit under test 13 change over time due to the effect of power supply noise, crosstalk noise, or the like. In other words, the worst delay of the circuit under test 13 changes depending on the time.

For example, FIG. 8 is a diagram for explaining a change in delay characteristics of the circuit under test. In the example illustrated in FIG. 8, in the first measurement, the circuit under test 13 delays a signal until the $X_{set}$ signal is transmitted to the fourth flip-flop. In the second measurement, the circuit under test 13 delays a signal until the $X_{set}$ signal is transmitted to the sixth flip-flop. In the third measurement, the circuit under test 13 delays a signal until the $X_{set}$ signal is transmitted to the third flip-flop.

In such an example, when the delay characteristics of the circuit under test are continuously measured, the conventional delay measuring circuit retains only the third measurement result, which is the latest measurement result. Therefore, the conventional delay measuring circuit does not output the second measurement result, which is the worst delay of the circuit under test.

In contrast, in each of the retaining circuits 25 to 27 according to the first embodiment, when the flip-flop retains the SET signal, the path that transmits the STOP signal to the flip-flop is interrupted. In other words, when the delay measuring circuit 20 continuously measures the delay characteristics of the circuit under test 13, once the SET signal is received before the STOP signal, each of the retaining circuits 25 to 27 continues to retain the $X_{retention}$ signal.

Therefore, in the example illustrated in FIG. 8, when the delay measuring circuit 20 continuously measures the delay characteristics of the circuit under test 13, the delay measuring circuit 20 continues to retain the second measurement result illustrated in FIG. 8. As a result, when the delay characteristics of the circuit under test 13 are continuously measured, the chip 1 can appropriately measure the worst delay of the circuit under test 13.

Moreover, when a user measures the delay characteristics of the circuit under test by using the conventional delay measuring circuit, the user does not appropriately measure the worst delay; therefore, the delay margin is overestimated in some cases. However, the delay measuring circuit 20 can appropriately measure the worst delay of the circuit under test 13; therefore, overestimation of the delay margin can be prevented.

Moreover, when the Inst_R6 interrupts the net_R5, the potential of the net_R5 becomes unstable in some cases due to the effect of noise. In such a case, the potential of the net_R5 transitions to a high level, a voltage higher than a predetermined threshold is applied to the terminal CK of the Inst_R3, and the Inst_R3 retains the new potential of the net_R2.

Thus, when the Inst_R3 retains the SET1 signal, the retaining circuit 25 disconnects the wire that transmits the STOP1 signal to the Inst_R3 and connects the net_R5 and the earth, thereby fixing the potential of the net_R5 at 0 V. Therefore, the retaining circuit 25 can prevent the voltage value of the net_R5 from becoming a high level.

As a result, the retaining circuit 25 can appropriately continue to retain the information retained in the D flip-flop. After the Inst_R6 disconnects the wire, the net_R5 becomes unstable for the delay of the Inst_R10 until the net_R5 is fixed at 0 V; however, the time thereof is sufficiently short and thus the actual operation is not affected.

Flow of Operations by Delay Measuring Circuit

Figure 9:
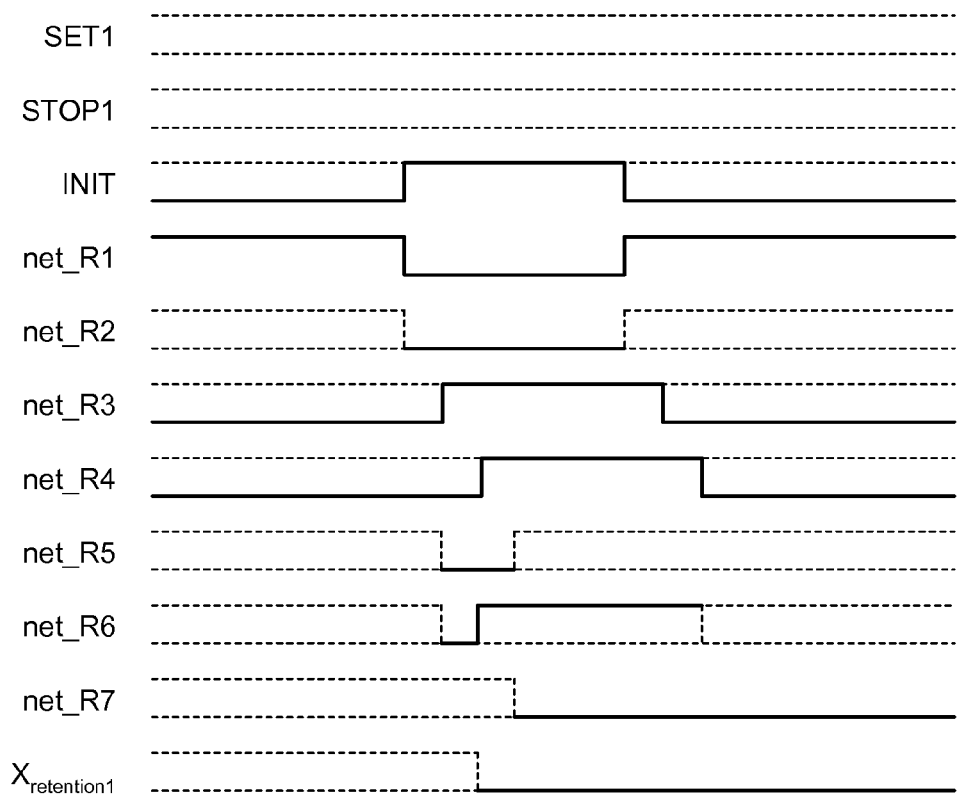
FIG. 9 is a time chart for explaining the initialization of the delay measuring circuit according to the first embodiment.

Next, the flow of the operations performed by the delay measuring circuit 20 according to the first embodiment will be described with reference to the drawings. First, the operation of initializing each of the units 23 to 27 included in the delay measuring circuit 20 will be described with reference to FIG. 9. FIG. 9 is a time chart for explaining the initialization of the delay measuring circuit 20 according to the first embodiment. The time chart illustrated in FIG. 9 indicates whether the values of the SET1 signal, the STOP1 signal, the INIT signal, the net_R1 to the net_R7, and the $X_{rentention1}$ signal are at a high level or a low level.

For example, as indicated by the solid lines in FIG. 9, when a high-level voltage is applied as the INIT signal, the retaining circuit 25 applies a voltage inverted to a low level by the Inst_R4 to the Inst_R2. Therefore, the retaining circuit 25 applies a low-level voltage to the terminal D of the Inst_R3 via the net_R2. Moreover, when the retaining circuit 25 receives a high-level signal as the INIT signal, the retaining circuit 25 delays the received INIT signal by using the Inst_R5 and the Inst_R9. Then, the retaining circuit 25 inputs the delayed INIT signal to the Inst_R1.

Thereafter, the retaining circuit 25 inputs the delayed INIT signal to the terminal CK of the Inst_R3 via the net_R6. In other words, the retaining circuit 25 applies a high-level voltage to the terminal CK of the Inst_R3. As a result, the Inst_R3 retains a low level of the terminal D; therefore, the value of the $X_{rentention1}$ signal becomes a low level. In other words, when the retaining circuit 25 receives the INIT signal, the retaining circuit 25 resets the state of the Inst_R3.

The retaining circuit 25 delays the received INIT signal by using the Inst_R5 and the Inst_R9 and inputs the delayed INIT signal to the Init_R3 as a trigger signal. Therefore, when the retaining circuit 25 receives the INIT signal, the retaining circuit 25 prevents the trigger signal from being input to the terminal CK of the Inst_R3 before the INIT signal inverted by the Inst_R4 is input to the terminal D of the Inst_R3.

Figure 10:
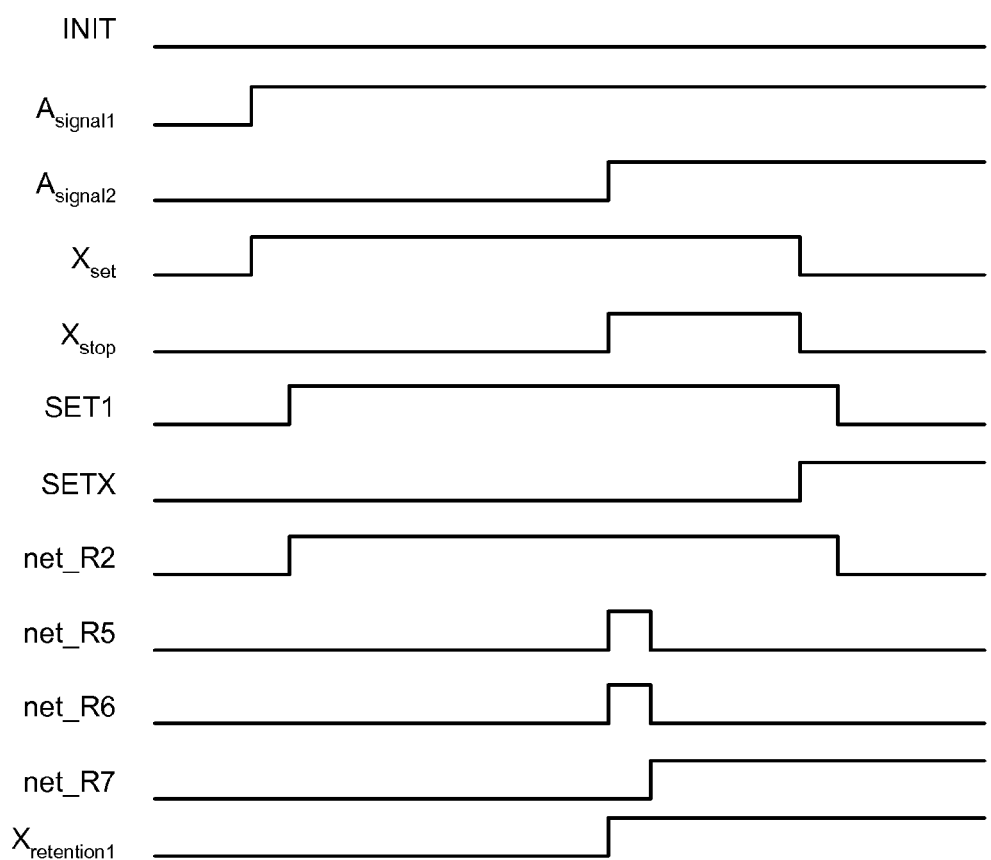
FIG. 10 is a time chart for explaining a process of retaining a SET signal performed by the retaining circuit according to the first embodiment.

Next, the operation of retaining the SET1 signal and outputting the $X_{rentention1}$ signal by the retaining circuit 25 will be described with reference to FIG. 10. FIG. 10 is a time chart for explaining a process of retaining the SET signal performed by the retaining circuit according to the first embodiment. The example illustrated in FIG. 10 indicates whether the values of the INIT signal, the $A_{signal1}$ to $A_{signal2}$ signals, the $X_{set}$ signal, the $X_{stop}$ signal, the SET1 signal, the SETX signal, the net_R2, the net_R5 to the net_R7, and the $X_{rentention1}$ signal are at a high level or a low level.

In the example illustrated in FIG. 10, when the set pulse generator 21 receives the $A_{signal1}$ signal, the set pulse generator 21 outputs the $X_{set}$ signal with a predetermined waveform. Thereafter, when the retaining circuit 25 receives the SET1 signal that is the $X_{set}$ signal delayed by the delay cell #1, the retaining circuit 25 applies a high-level voltage to the terminal D of the Inst_R3 via the net_R2.

Moreover, when the stop pulse generator 22 receives the $A_{signal2}$ signal, the stop pulse generator 22 outputs the $X_{stop}$ signal with a predetermined waveform. Then, the retaining circuit 25 applies a high-level voltage to the terminal CK of the Inst_R3 via the net_R5 and the net_R6. Therefore, the high level signal at the terminal D is set for the output of the terminal Q of the Inst_R3 and the $X_{rentention1}$ signal having a high-level value is output.

Moreover, the retaining circuit 25 inputs the $X_{rentention1}$ signal delayed by using the Inst_R8 and the Inst_R10 to the Inst_R6 and the Inst_R11 and lowers the potential of the net_R5 to the ground. Thus, even when a new STOP1 signal is input, the retaining circuit 25 does not apply a high-level voltage to the terminal CK of the Inst_R3; therefore, the value of the Inst_R3 can be appropriately retained.

Figure 11:
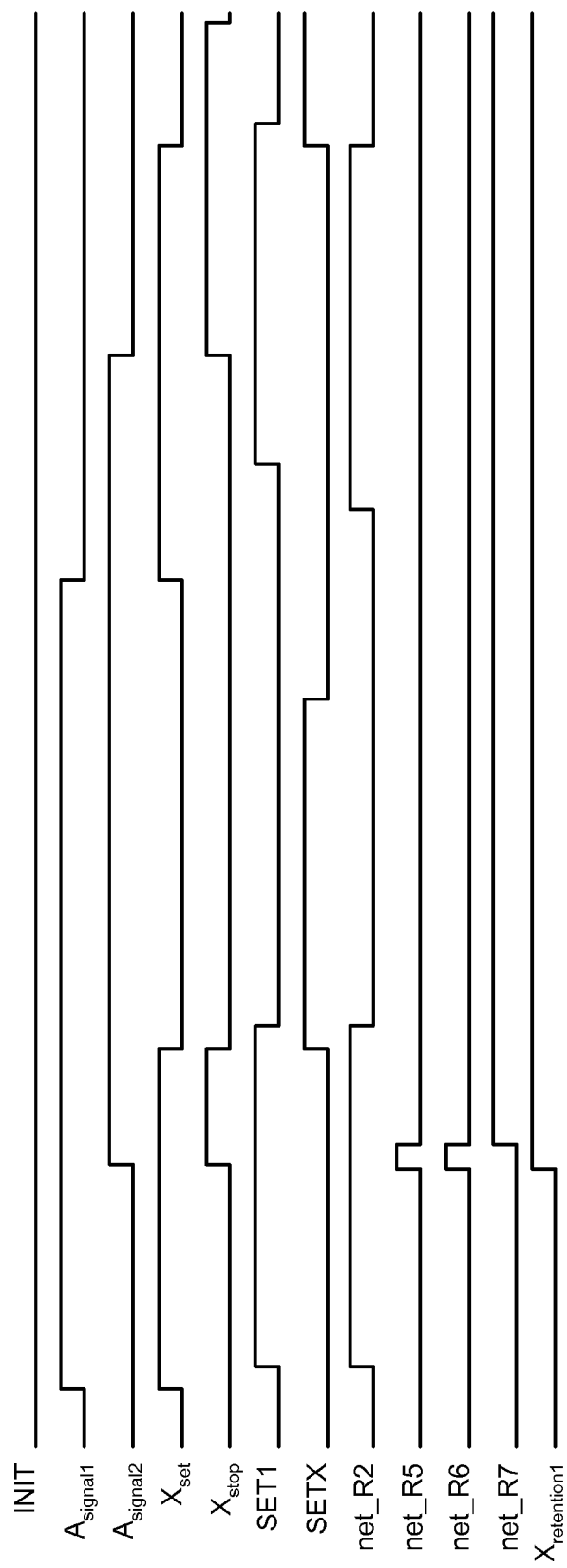
FIG. 11 is a time chart for explaining a process of continuing to retain a captured signal.
Figure 12:
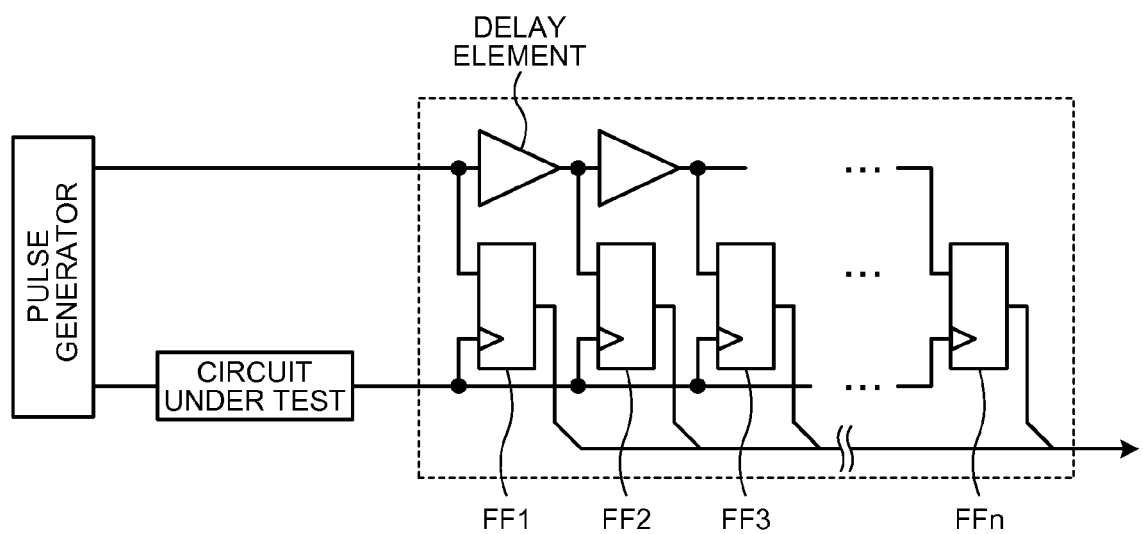
FIG. 12 is a diagram for explaining a delay measuring circuit.

Next, the operation of retaining the output of the $X_{rentention1}$ by the retaining circuit 25 will be described with reference to FIG. 11. FIG. 11 is a time chart for explaining a process of continuing to retain a captured signal. The example in FIG. 11 indicates whether the values of the INIT signal, the $A_{signal1}$ to $A_{signal2}$ signals, the $X_{set}$ signal, the $X_{stop}$ signal, the SET1 signal, the SETX signal, the net_R2, the net_R5 to the net_R7, and the $X_{rentention1}$ signal are at a high level or a low level. The process of capturing the SET1 signal performed by the retaining circuit 25 is the same as that in FIG. 10; therefore, an explanation thereof is omitted.

For example, in the example illustrated in FIG. 11, a new $X_{stop}$ signal is generated due to the edge at which the $A_{signal2}$ signal transitions from a high level to a low level. In such a case, the retaining circuit 25 receives the STOP1 signal. However, the retaining circuit 25 interrupts the connection between the Inst_R3 and the stop pulse generator 22 and connects the net_R5 to the ground. Therefore, the retaining circuit 25 does not apply a high-level voltage to the terminal CK of the Inst_R3 and continues to retain the value of the Inst_R3. Thus, the retaining circuit 25 can continue to retain the $X_{rentention1}$ signal at a high level.

Moreover, even when a new $A_{signal1}$ signal is output and the retaining circuit 25 receives a new SET1 signal, the retaining circuit 25 does not input a trigger signal to the Inst_R3 and therefore continues to retain the value of the Inst_R3. Therefore, the retaining circuit 25 can keep the $X_{rentention1}$ signal at a high level. When the retaining circuits 26 to 27 receive the SET2 to SETX signals before the STOP2 to STOPX signals, respectively, the retaining circuits 26 to 27 perform an operation in a similar manner to the retaining circuit 25 and therefore can keep the $X_{retention2}$ to $X_{retentionx}$ signals at a high level, respectively. As a result, the chip 1 can retain the worst delay of the circuit under test 13.

Effect of First Embodiment

As described above, the delay measuring circuit 20 according to the first embodiment includes the set pulse generator 21 that, when the logical value of the $A_{signal1}$ signal input to the circuit under test 13 changes, generates the $X_{set}$ signal with a predetermined waveform regardless of whether the change is positive or negative. Moreover, the delay measuring circuit 20 includes the stop pulse generator 22 that, when the logical value of the $A_{signal2}$ signal output from the circuit under test 13 changes, generates the $X_{stop}$ signal with a predetermined waveform regardless of whether the change is positive or negative.

Moreover, the delay measuring circuit 20 includes a plurality of the delay cells #1 to #x that delay the $X_{set}$ signal. Furthermore, the delay measuring circuit 20 includes the delay information retaining unit 24 that individually captures and retains the $X_{set}$ signal output from each of the delay cells #1 to #x between when the $X_{set}$ signal is generated and when the $X_{stop}$ signal is generated.

Therefore, the delay measuring circuit 20 can measure the delay characteristics of the circuit under test 13 regardless of the waveform of the signal input to the circuit under test 13. In other words, even when the circuit under test 13 has delay characteristics that differ depending on the input waveform, the delay measuring circuit 20 can appropriately measure the delay characteristics. Therefore, the delay measuring circuit 20 can appropriately measure the worst delay of the circuit under test 13.

Moreover, when the logical value of the $A_{signal1}$ signal transitions from a high level to a low level or when the logical value of the $A_{signal1}$ signal transitions from a low level to a high level, the set pulse generator 21 outputs the $X_{set}$ signal with a predetermined waveform. Moreover, when the logical value of the $A_{signal2}$ signal transitions from a high level to a low level or when the logical value of the $A_{signal2}$ signal transitions from a low level to a high level, the stop pulse generator 22 outputs the $X_{stop}$ signal with a predetermined waveform.

Therefore, the delay measuring circuit 20 can appropriately measure the worst delay of the circuit under test 13 not only when the logical value of a signal input to the circuit under test 13 transitions from a low level to a high level but also when the logical value transitions from a high level to a low level.

Moreover, the delay measuring circuit 20 includes a plurality of the retaining circuits 25 to 27. Moreover, each of the retaining circuits 25 to 27 includes a D flip-flop that receives the SET signal output from a corresponding one of the delay cells #1 to #x and receives the $X_{stop}$ signal. Then, when the D flip-flop included in each of the retaining circuits 25 to 27 receives the $X_{stop}$ signal after receiving the SET signal output from a corresponding one of the delay cells #1 to #x, the D flip-flop retains the received SET signal. Therefore, when the delay characteristics of the circuit under test 13 are continuously measured, the delay measuring circuit 20 can continue to retain information on the worst delay generated by the circuit under test 13.

Moreover, in each of the retaining circuits 25 to 27, when the D flip-flop retains the SET signal, the path that connects the D flip-flop and the stop pulse generator 22 is interrupted and the voltage value of the wiring portion that inputs the $X_{stop}$ signal to the D flip-flop is lowered to the ground, i.e., a low level. Therefore, the delay measuring circuit 20 can prevent the circuit portion that inputs the $X_{stop}$ signal to the D flip-flop from generating a high-level voltage due to the effect of noise. As a result, the delay measuring circuit 20 can appropriately continue to retain information on the delay retained in the D flip-flop.

[b] Second Embodiment

Although the embodiment of the present invention has been described, the embodiment may be embodied in various different forms other than the embodiment described above. Hereinafter, another embodiment included in the present invention will be described as the second embodiment.

(1) Circuit Configuration

The delay measuring circuit 20 according to the first embodiment has the circuit configuration illustrated in FIG. 2. However, the embodiment is not limited to this and the delay measuring circuit 20 may be a delay measuring circuit that has a different circuit configuration but has a similar function. The chip 1 according to the first embodiment includes the ring oscillator 2 separately from the measuring unit 10. However, the embodiment is not limited to this and the ring oscillator 2 and the measuring unit 10 may be circuits independent of each other.

Moreover, the measuring unit 10 is mounted on the independent chip 1 only for measuring the delay characteristics of the circuit under test 13. However, the embodiment is not limited to this and, for example, the measuring unit 10 may be mounted on a chip to which a technology such as DVFS (Dynamic Voltage and Frequency Scaling) is applied and measure the delay characteristics when the circuit under test 13 actually operates every time a dynamic voltage control is performed. In this case, the value of each of the $X_{retention1}$ to $X_{retentionx}$ signals retained in the retaining circuits 26 to 27 may be read from the CPU (Central Processing Unit) in the chip 1 via a bus (not illustrated) in the chip 1.

(2) Number of Delay Cells

The delay measuring circuit 20 according to the first embodiment includes a plurality of the delay cells #1 to #x. However, the embodiment is not limited to this and the delay measuring circuit may include any number of delay cells. Moreover, the delay measuring circuit 20 may include a delay unit that, when the $X_{set}$ signal is received, sequentially transmits the received $X_{set}$ signal to each of the retaining circuit 25 to 26 at predetermined time intervals.

(3) Fixing of Potential of net_R5 by Inst_R11

When the Inst_R3 fixes the output of the terminal Q at a high level, the Inst_R11 according to the first embodiment fixes the potential of the net_R5 at 0 V by causing the net_R5 and the ground to electrically communicate with each other. However, the embodiment is not limited to this and a high-level signal may be prevented from being input to the terminal CK of the Inst_R3 from the Inst_R1 by fixing the potential of the net_R5 at the potential to the degree determined to be a low level.

According to one aspect, the worst delay of the circuit under test is appropriately measured.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A delay measuring circuit comprising:
   a first trigger-signal generating unit that, when a value of a signal input to a circuit under test, in which an input signal and an output signal have a one-to-one correspondence with each other, changes, generates a first trigger signal;
   a second trigger-signal generating unit that, when a value of a signal output from the circuit under test changes, generates a second trigger signal;
   a delay unit that includes a plurality of delay elements, which delay the first trigger signal generated by the first trigger-signal generating unit, connected in series; and
   a delay information retaining unit that individually captures and retains the first trigger signal output from each of the delay elements included in the delay unit between when the first trigger signal is generated by the first trigger-signal generating unit and when the second trigger signal is generated by the second trigger-signal generating unit.

2. The delay measuring circuit according to claim 1, wherein
   when a value of a signal input to the circuit under test transitions from high to low or when the value of the signal transitions from low to high, the first trigger-signal generating unit generates the first trigger signal, and
   when a value of a signal output from the circuit under test transitions from high to low or when the value of the signal transitions from low to high, the second trigger-signal generating unit generates the second trigger signal.

3. The delay measuring circuit according to claim 1, wherein the delay information retaining unit includes a plurality of flip-flops each of which retains, when the second trigger-signal generating unit generates the second trigger signal, a first trigger signal output from a corresponding one of the delay elements.

4. The delay measuring circuit according to claim 3, wherein when the flip-flop retains the first trigger signal, the delay information retaining unit terminates a connection between the flip-flop and the second trigger-signal generating unit and fixes a voltage value of a circuit portion that inputs the second trigger signal to the flip-flop at a low level.

5. A delay measuring circuit comprising:
   a delay circuit that includes a plurality of delay elements, which delay an input signal, connected in series;
   a signal input circuit that inputs a trigger signal with a predetermined waveform to a circuit under test, in which an input signal and an output signal have a one-to-one correspondence with each other, and the delay circuit; and
   a delay information retaining unit that includes a plurality of storage elements each of which individually captures a signal output from a delay element included in the delay circuit between when a trigger signal is input by the signal input circuit and when a trigger signal delayed by the circuit under test is output and keeps a value of the captured signal after a new trigger signal is output from the circuit under test.

6. A delay measuring method comprising:
   generating a first trigger signal when a value of a signal input to a circuit under test, in which an input signal and an output signal have a one-to-one correspondence with each other, changes;
   generating a second trigger signal when a value of a signal output from the circuit under test changes; and
   inputting the first trigger signal to a delay device in which a plurality of delay elements, which delay an input first trigger signal, are connected in series,
   retaining a first trigger signal output from each of the delay elements included in the delay device between when the first trigger signal is generated and when the second trigger signal is generated.

* * * * *